United States Patent [19]

Yoshizawa et al.

[11] Patent Number: 5,216,807
[45] Date of Patent: * Jun. 8, 1993

[54] METHOD OF PRODUCING ELECTRICAL CONNECTION MEMBERS

[75] Inventors: Tetsuo Yoshizawa, Yokohama; Yoshimi Terayama, Odawara; Hiroshi Kondo, Yokohama; Takashi Sakaki, Tokyo; Shunichi Haga, Yokohama; Yasuteru Ichida, Machida; Masaki Konishi, Ebina, all of Japan

[73] Assignee: Canon Kabushiki Kaisha, Tokyo, Japan

[*] Notice: The portion of the term of this patent subsequent to May 22, 2007 has been disclaimed.

[21] Appl. No.: 832,653

[22] Filed: Feb. 11, 1992

Related U.S. Application Data

[63] Continuation of Ser. No. 488,241, Mar. 5, 1990, abandoned, which is a continuation of Ser. No. 358,269, May 30, 1989, Pat. No. 4,926,549.

[30] Foreign Application Priority Data

May 31, 1988 [JP] Japan .................................. 63-133401

[51] Int. Cl.$^5$ ............................................. H01R 43/70
[52] U.S. Cl. ..................................... 29/876; 174/262; 439/66
[58] Field of Search ................. 29/825, 852, 876, 884; 174/261, 262, 263; 427/97; 439/66

[56] References Cited

U.S. PATENT DOCUMENTS

| | | |
|---|---|---|
| 2,961,746 | 11/1960 | Lyman . |
| 3,193,789 | 7/1965 | Brown . |
| 3,541,222 | 11/1970 | Park et al. . |
| 3,680,037 | 7/1972 | Nellis et al. . |
| 3,778,900 | 12/1973 | Haining et al. . |
| 3,971,610 | 7/1976 | Buchoff et al. . |
| 4,050,756 | 9/1977 | Moore . |
| 4,064,623 | 12/1977 | Moore . |
| 4,067,945 | 1/1978 | DuRocher ...................... 264/104 |
| 4,240,198 | 12/1980 | Alonso . |
| 4,323,593 | 4/1982 | Tsunashima . |
| 4,628,406 | 12/1986 | Smith et al. . |

FOREIGN PATENT DOCUMENTS 0114211 1/1984 European Pat. Off. .
WO86/00173 1/1986 PCT Int'l Appl. .

Primary Examiner—Carl J. Arbes
Attorney, Agent, or Firm—Fitzpatrick, Cella, Harper & Scinto

[57] ABSTRACT

A method of producing an electrical connection member includes the steps of applying a carrier containing a light-sensitive resin onto a substrate member, forming holes in portions of the carrier to form a pattern and expose the substrate member in the holes, filling each hole in the carrier with an electrically conductive member, and removing the substrate member from the carrier. With this method, it is possible to easily produce electrical connection members in which high density electrical connecting portions can be provided and in which the reliability and security of electrical connections can be improved.

17 Claims, 15 Drawing Sheets

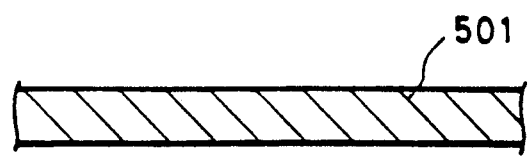
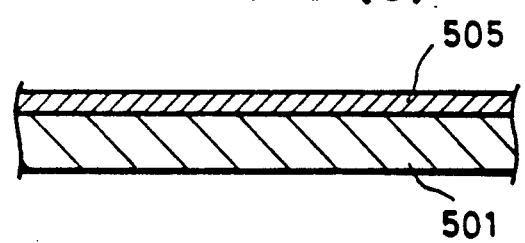
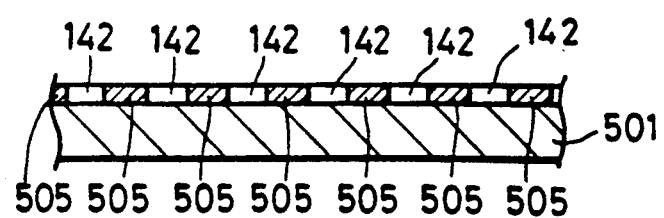

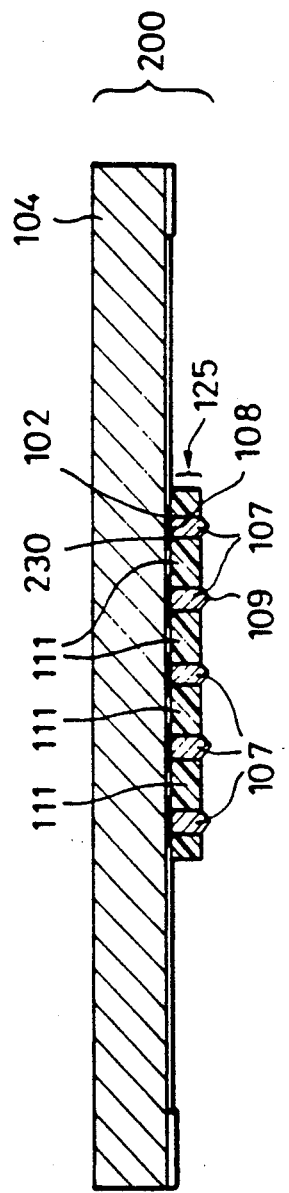
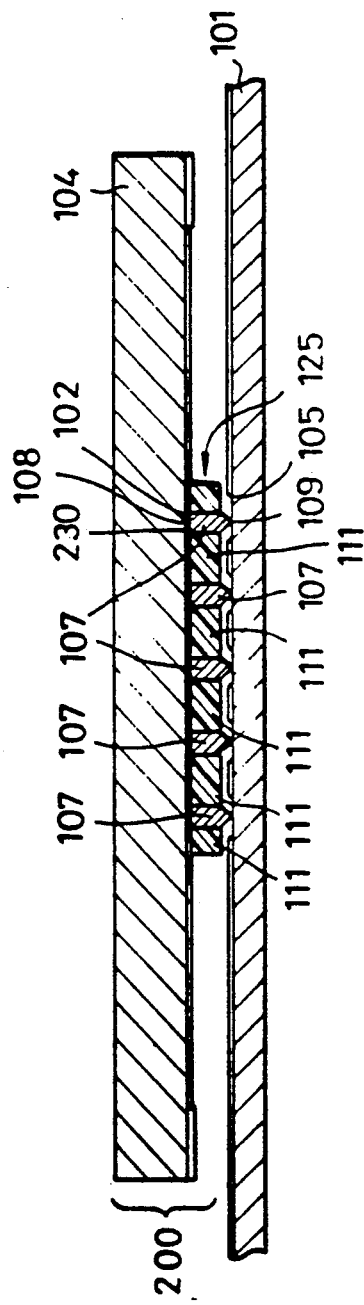

METHOD OF PRODUCING ELECTRICAL CONNECTION MEMBERS

This application is a continuation of application Ser. No. 07/488,241 filed Mar. 5, 1990, now abandoned, which is a continuation of application Ser. No. 07/358,269 filed May 30, 1989, now U.S. Pat. No. 4,926,549.

BACKGROUND OF THE INVENTION

Field of the Invention

The present invention relates to a method of producing electrical connection members for use in forming electrical connections between electrical circuit parts.

Description of the Related Background Art

It is common practice to connect electrical circuit parts by a wire-bonding method, a CCB (controlled collapse bonding) method, a TAB (tape automated bonding) method, a method utilizing anisotropic conducting film, a method utilizing a sheet-like electrical connection member of the type in which pins made of electrically conductive material are buried in electrical insulation resin, or the like.

Of these methods, the method utilizing a sheet-like electrical connection member of the type in which pins made of electrically conductive material are buried in electrical insulation resin has a number of advantages. For example, electrical circuit parts can be connected under constant pressure so that a stable connection therebetween can be achieved. Variations in connection resistance can be kept to a minimum and it is possible to increase the density of the connecting portions of the electrical connection member.

As shown in FIGS. 1(a) and 1(b), the above-described type of electrical connection member 125 has a construction in which pins 121 made of electrically conductive material are buried in a sheet-like carrier made of electrical insulation resin 123. The illustrated electrical connection member 125 has heretofore been produced by the method shown in FIG. 2 (disclosed in, for example, U.S. Pat. No. 3,862,790).

This method of producing the above-described type of electrical connection member comprises the steps of lacing, as shown in FIG. 2, a conductor wire 124 around rods 122 which are disposed at a desired pitch in a staggered manner, the conductor wire 124 having a predetermined diameter and to be cut into the pins 121 which constitute part of each electrical connection member 125; molding this conductor wire 124 with the resin 123 having electrical insulation properties; curing the resin 123; and cutting the cured product into the sheet-like electrical connection members 125 each having a desired thickness.

However, the above-described conventional method of producing electrical connection members has a number of problems. First, since it takes a long time to cure the resin having electrical insulation properties, the production of electrical connection members involves a time-consuming operation. Second, since the cured product is cut into sheet-like electrical connection members, it is difficult to minimize the sheet thickness and only relatively thick electrical connection members can be obtained. Third, if an inappropriate cutting method is selected, conductor wire which is buried at high density may be deformed or damaged during cutting. In a case where an electrical connection member including a deformed portion of the conductor wire is used in practice, an unwanted conducting path may be formed due to the contact between adjacent deformed portions of the conductor wire which constitutes electrically conducting portions of the electrical connection member. Fourth, since the electrically conducting portions are formed by utilizing the method of lacing conductor wire in a staggered manner, the density of the electrically conducting portions is limited. Another disadvantage of the electrical connection member produced by the aforesaid method is that, since the conductor wire which constitutes the electrically conducting portions is approximately equal in diameter to holes which retain the conductor wire in the resin layer of the electrical connection member, the conductor wire tends to easily come away from the resin layer. This disadvantage may lead to a deterioration in the reliability of electrical connection. A further disadvantage of the electrical connection member produced by the aforesaid method is that, since the surfaces of the sheet-like carrier made of the resin having electrical insulating properties are flush with the contact ends of the electrically conducting portions, it is difficult to achieve a reliable connection with electrical circuit parts. To solve this problem, it is preferable that the contact ends of the electrically conducting portions be formed into a bump-like configuration. However, to attain the bump-like configuration, it is necessary that the surface of the resin carrier of the sheet-like electrical connection member be etched to expose electrically conductive members made from the conductor wire and the exposed conductive members be then melted either mechanically or thermally. Accordingly, the production process inevitably becomes complicated.

SUMMARY OF THE INVENTION

It is, therefore, one object of the present invention to solve the above-described problems of the background art method of producing electrical connection members.

It is another object of the present invention to provide a method of producing electrical connection members of the type in which connecting portions are provided in a high density even when the thickness thereof is reduced to an adequate degree, and which not only enables stable electrical connection to be provided but also allows for a simplified production process.

It is another object of the present invention to provide a method with which it is possible to form bumps on conductor wire without the need for a complicated process and which makes it possible to produce reliable electrical connection members which offers stable connection and in which the conductor wire does not come away from a resin layer.

It is another object of the present invention to provide a method of producing electrical connection members, comprising the steps of forming a carrier containing a light-sensitive resin on a first electrically conductive member; forming holes in portions of the carrier by exposing the first electrically conductive member through the holes; filling the holes formed in the carrier with second electrically conductive members; and eliminating the first electrically conductive member from the carrier.

It is still another object of the present invention is to provide a method of producing electrical connection members, comprising the steps of forming a carrier on a first electrically conductive member; forming holes in portions of the carrier by and etching, exposing the first electrically conductive member through the holes; etching the portions of the first electrically conductive member which are exposed in the respective holes formed in the carrier, thereby forming recesses in the first electrically conductive member so that each of the recesses has a diameter larger than the diameter of a corresponding one of the holes; filling the respective holes formed in the carrier with second electrically conductive members; and eliminating the first electrically conductive member from the carrier.

It is yet another object of the present invention to provide a method of producing electrical connection members, comprising the steps of: forming a first carrier containing a light-sensitive resin on a first electrically conductive member; forming holes in portions of the first carrier, to expose the first electrically conductive member through the holes; filling the respective holes formed in the first carrier with second electrically conductive members; and; forming a second carrier containing a light-sensitive resin on the first electrically conductive member having the holes filled with the second electrically conductive members; forming holes in predetermined portions of the second carrier to expose the second electrically conductive member through the holes; filling the respective holes formed in the second carrier with third electrically conductive members; and eliminating the first electrically conductive member from the first carrier.

It is a further object of the present invention to provide a method of producing electrical connection members, comprising the steps of: forming a first carrier on a first electrically conductive member; forming holes in portions of the first carrier, thereby partially exposing a surface of the first electrically conductive member in the holes; etching the portions of the first electrically conductive member which are exposed in the respective holes formed in the carrier, thereby forming recesses in the first electrically conductive member so that each of the recesses has a diameter larger than the diameter of a corresponding one of the holes; filling the respective holes formed in the first carrier with second electrically conductive members; forming a second carrier containing a light-sensitive resin on the first electrically conductive member having the holes filled with the second electrically conductive members; forming holes in portions of the second carrier, to expose the second electrically conductive member in the holes; filling the respective holes formed in the second carrier with third electrically conductive members; and eliminating the first electrically conductive member from the first carrier.

BRIEF DESCRIPTION OF THE DRAWINGS

FIGS. 3(a) to 3(f) are diagrammatic cross-sectional views which serve to illustrate the process sequence of one embodiment of a method of producing electrical connection members in accordance with the present invention;

DESCRIPTION OF THE PREFERRED EMBODIMENTS

Figure 1:
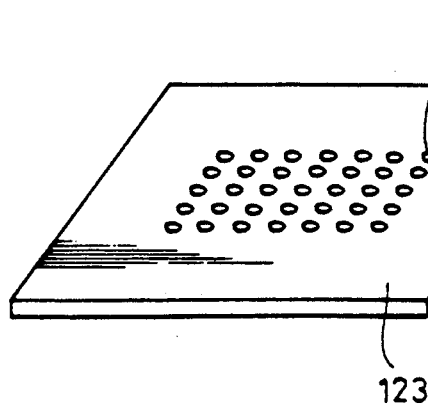
FIGS. 1(a) and 1(b) are diagrammatic cross-sectional views which serve to illustrate a conventional method.
Figure 1:
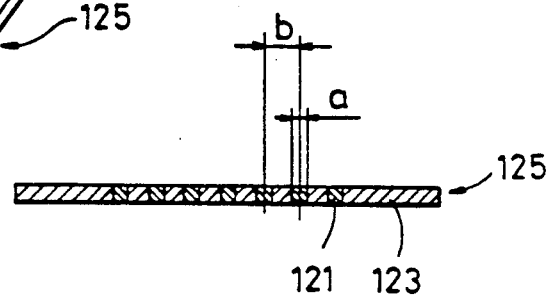
Figure 2:
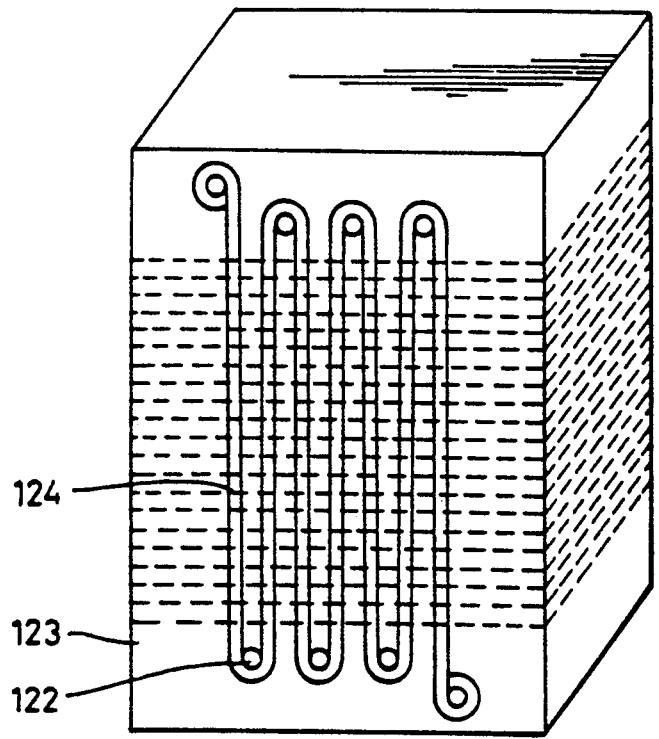
FIG. 2 is a diagrammatic perspective view which serves to illustrate the conventional method.

The general construction of an electrical connection member produced by a method according to the present invention will first be described and, subsequently, the method of producing such an electrical connection member will be described in detail.

Electrical Connection Member

An electrical connection member of the type produced by a method according to the present invention consists of a carrier made of an electrically insulating material and a plurality of electrically conductive members buried in the carrier, the electrically conductive members being partially exposed on the opposite surfaces of the carrier. The electrical connection member may further include a wiring pattern. This wiring pattern may be formed in the interior of the carrier or on either or both of the opposite surfaces of the carrier. Incidentally, electrical connection members of the type having a wiring pattern formed on either or both of the opposite surfaces of the carrier can be produced more easily than electrical connection members of the type having a wiring pattern formed in the interior of the carrier.

The wiring pattern may be or may not be electrically connected to the individual electrically conductive members buried in the carrier. Moreover, the wiring pattern and the electrically conductive members may be electrically connected in the interior of the carrier or on either or both of the opposite surfaces of the carrier. In this case, it is possible to more easily produce electrical connection members of the type in which the wiring pattern and the electrically conductive members are electrically connected on either or both of the opposite surfaces of the carrier. The material of the wiring pattern is not limited to an electrically conductive metallic material, and any other kind of electrically conductive material may be employed.

The connecting portions of electrical circuit parts may be connected to the contact ends (connecting portions) of the individual electrically conductive members, or they may be connected to the wiring pattern.

It is desirable that the ends of the connecting portions of the respective electrically conductive members have a protruding configuration in order to achieve a reliable connection with the electrical circuit parts and to prevent the electrically conductive members from becoming disconnected from the electrical connection member.

Such an electrical connection member may be either of the single-layer type or of the multi-layer type, the latter consisting of two or more layers.

First Electrically Conductive Member

The first electrically conductive member may have an electrically conductive material provided on at least one part of either of its opposite surfaces, or it may be entirely made of electrically conductive material. Specifically, the entire first electrically conductive member may be made of a first electrically conductive material (for example, it may be formed from a sheet-like member made of the first electrically conductive material). Otherwise, a first electrically conductive material can be provided on at least one part of a resin sheet (support member). This first electrically conductive material may be selected from among materials which will be described later in the section "ELECTRICALLY CONDUCTIVE MEMBER". It is necessary, however, that the type of first electrically conductive material differ from the type of second electrically conductive material which forms the second electrically conductive members.

It is to be noted that the type of material which forms a third electrically conductive member may be the same as the material which forms the first electrically conductive member. On the other hand, the type of material which forms the second electrically conductive members may or may not be the same as the material which forms the third electrically conductive member.

Application of Resin, Exposure, Etching

In the present invention, a resin having electrically insulating characteristics is applied to the first electrically conductive member made of the first electrically conductive material, thereby forming a carrier. The means of application may be arbitrarily selected.

The resin having electrically insulating characteristics may be selected from among various materials which will be described later in the section "CARRIER". It is particularly desirable to employ a light-sensitive resin of the type which has electrically insulating characteristics and which can satisfy various requirements concerning formability, heat resistance, weather resistance, reliability (for example, the degree of shielding effect with respect to harmful electromagnetic waves), and the like. As an example, it is preferable that light-sensitive polyimide resin be used, but it is of course possible to employ any other kind of resin which can be cured when illuminated with light.

In a case where a light-sensitive resin is used as the resin having electrically insulating characteristics, after such a resin has been applied, the portions of the resin to be cured are illuminated with light (EXPOSURE). In this exposure step, a photomask may be employed.

After the exposure has been completed, the optically cured portion of the resin is eliminated by development and holes are formed. The electrically conductive material which constitutes the first electrically conductive member is exposed through these holes.

Then, in accordance with the present invention, the portions of the first electrically conductive member which have been exposed through the holes are etched (ETCHING).

It is preferable that the above etching be continued until the diameters of recesses to be formed by this etching become larger than those of the corresponding holes formed in the carrier.

Since the above-described recesses are formed in the first electrically conductive member by etching, when the second electrically conductive members (which will be described later) are filled into the respective holes in the carrier, the second electrically conductive members are also filled into these recesses, thereby forming bumps.

Since the portions of the respective second electrically conductive members which are exposed through the carrier are formed into bumps, it is possible to prevent the second electrically conductive members from disconnecting from the holes after the assembly of an electrical connection member. It is also possible to achieve reliable connections with the connecting portions of electrical circuit parts.

In this etching step, it is possible to employ any kind of etching liquid which etches the first electrically conductive material and yet which does not etch the resin constituting the carrier.

Filling of Second Electrically Conductive Members and Elimination of First Electrically Conductive Member In the present invention, the second electrically conductive members are filled into the recesses formed by etching. (These second electrically conductive members serve as electrically conductive members which constitute the connecting portions of the electrical connection member). The second electrically conductive members may be filled by, for example, plating, but another suitable method such as vapor deposition may also be employed.

The material which forms the second electrically conductive members may be filled until their end surfaces become flush with or project above the outside surface of the formed carrier (that is, the surface of the carrier which is opposite to the surface carrying the first electrically conductive member).

If such a material is filled until the end surfaces of the second electrically conductive members project above the outside surface of the carrier, it is possible to improve the state of connection with electrical circuit parts and to prevent the second electrically conductive members from disconnecting from the carrier.

After the above filling step has been completed, the electrically conductive material of the first electrically conductive member is eliminated by etching using an appropriate etching liquid. In this etching step, it is preferable that the etching liquid be of the kind which etches only the electrically conductive material of the first electrically conductive member and yet which does not etch the electrically conductive material of the second electrically conductive members.

If an electrical connection member having a wiring pattern is to be produced, the wiring pattern may be provided on a surface of the carrier or on surfaces of the second electrically conductive members after the filling step described above has been completed. Incidentally, the wiring pattern may be provided either before or after the first electrically conductive member has been eliminated.

If such an electrical connection member is used as a probe card, as will be described later in detail, its electrically conductive members serve as a probing portion.

Material of Electrically Conductive Member of Electrical Connection Member

When all the process steps of the present invention are completed, the second electrically conductive members serve as electrically conductive members which constitute the connecting portions of the electrical connection member.

The electrically conductive members may be made of any kind of material which exhibits electrical conductivity, and a metallic material is commonly employed. In place of a metallic material, a material which exhibits superconductivity may be used.

It is desirable that gold be used as the metallic material. However, a suitable metal or metallic alloy other than gold may also be employed, and typical examples are Ag, Be, Ca, Mg, Mo, Ni, W, Fe, Ti, In, Ta, Zn, Cu, Al, Sn and Pb-Sn.

In the metal or alloy material of an identical electrical connection member, the same kind of metal may be present or metals of different kinds may be present. Moreover, one metal or alloy member which constitutes part of the electrical connection member may be made of the same kind of metal or alloy, or it may be made of metals or alloys of different kinds. It is also possible to employ any other electrically conductive material other than a metal or alloy, for example, a material consisting of a metallic material which contains at least an organic material or an inorganic material. Provided that sufficient electrical conductivity can be obtained, a composition of organic and inorganic materials may also be used.

The cross-sectional configuration of each of the electrically conductive members may be round, square, or similar.

The diameters of the electrically conductive members are not limited to a specific value. For example, such a diameter may be made greater than or less than 20 $\mu$m by taking into account the pitch of the connecting portions of the electrical circuit part.

The exposed end surfaces of the electrically conductive members may be flush with or project above the outside surface of the carrier. These exposed end surfaces may be formed to project above either or both of the opposite surfaces of the carrier. If the bumps described above are formed on the opposite surfaces, it is possible to prevent the second electrically conductive members from disconnecting from the carrier and it is also possible to improve the connection with electrical circuit parts.

The intervals between adjacent electrically conductive members may be equal to or narrower than the intervals between adjacent connecting portions of an electrical circuit part. If the former intervals are narrower than the latter intervals, it is possible to connect the electrical circuit part to the electrical connection member without the need for a positioning operation. The electrically conductive members need not be vertically arranged in the carrier. For example, they may be arranged in the carrier such that they run in an inclined state from one surface to the other surface of the carrier.

Carrier which Constitutes Electrical Connection Member

The carrier used in the present invention may be made from a member consisting of an electrically insulating material.

The organic material may be selected from among, for example, electrically insulating materials, and it is possible to employ any kind of light-sensitive resin such as thermosetting resin, ultraviolet-curing resin, or thermoplastic resin. For example, the organic material may be selected from the group consisting of polyimide resin, polyphenylene sulfide resin, polyether sulfone resin, polyether imide resin, polysulfone resin, silicone resin, fluororesin, polycarbonate resin, polydiphenyl ether resin, polybenzyl imidazole resin, phenol resin, urea resin, melamine resin, alkyd resin, epoxy resin, polyamide-imide resin, polypropylene resin, polyvinyl chloride resin, polystryrene resin, methacrylate methyl resin, polyphenylene oxide resin, methacrylate plastics, vinylidene chloride resin, and similar kinds of resin or plastics.

In particular, if the light-sensitive polyimide resin is employed as the constituent material of the carrier, it is possible to provide an electrical connection member which is easy to form and which excels in heat resistance and weather resistance. Moreover, since the heat resistance of polyimide resin is particularly high, it is possible to easily achieve connection utilizing a metal or metallic alloy which is obtained by fusing the contacting surfaces of the electrical circuit part and the second electrically conductive members, as will be described later. The polyimide resin also has the effect of blocking harmful waves such as electromagnetic waves which would adversely affect electrical circuits.

The light-sensitive resin may be selected from among, for example, polyimide resin, silicone resin, and similar kinds of resin.

It is particularly preferable that a resin of good heat conductivity be selected from the above resins since the heat generated in an electrical circuit part such as a semiconductor device can be dissipated through the resin. If a resin is selected which has a thermal expansion coefficient approximately equal to that of the circuit board of the electrical connection member and if at least one hole or a plurality of bubbles are formed in the organic material, it is possible to prevent the reliability of the device from deteriorating due to thermal expansion or thermal shrinkage.

The metallic material or the alloy material may be selected from the group consisting of, for example, Ag, Cu, Au, Al, Be, Ca, Mg, Mo, Fe, Ni, Si, Co, Mn, W, Cr, Nb, Zr, Ti, Ta, Zn, Sn, and Pb-Sn.

The inorganic material may be selected from the group consisting of, for example, $SiO_2$, $B_2O_3$, $Al_2O_3$, $Na_2O$, $K_2O$, $CaO$, $ZnO$, $BaO$, $PbO$, $Sb_2O_3$, $As_2O_3$, $La_2O_3$, $ZrO_2$, $BaO$, $P_2O_5$, $TiO_2$, $MgO$, $SiC$, $BeO$, $BP$, $BN$, $AlN$, $B_4C$, $TaC$, $TiB_2$, $CrB_2$, $TiN$, $Si_3N_4$, $Ta_2O_5$, and other inorganic materials such as ceramics, diamond, glass, carbon, boron and the like.

In the present invention, if a material of good heat conductivity is used for the carrier, the heat generated in electrical circuit parts or probe cards can be made to rapidly escape to the outside. Accordingly, an electrical circuit device of good heat dissipation properties is obtained. If a material having a thermal expansion coefficient close to that of an electrical circuit part is used for the carrier, the thermal expansion coefficient of the carrier approximates that of the electrical circuit part. Accordingly, it is possible to prevent any phenomena which may deteriorate the reliability of the electrical circuit device, such as cracks in the electrical circuit part or variations in the characteristics thereof which may be caused during the application of heat. It is, therefore, possible to provide a highly reliable electrical circuit member.

In addition, if a material having a high magnetic shielding effect is used for the carrier, it is possible to reduce the amount of electromagnetic noise which may leak from the electrical circuit part to the outside. It is also possible to reduce the amount of electromagnetic noise which may enter the electrical circuit part from the outside.

The following is a description, referring to FIGS. 3(a) to 5(h), preferred embodiments of a method of producing electrical connection members in accordance with the present invention.

EMBODIMENT 1

As shown in FIG. 3(a), a first electrically conductive member 501 is initially prepared. In this embodiment, the first electrically conductive member 501 is made from a metallic sheet having characteristics suitable for such a conductive member. (The first electrically conductive member 501 is hereinafter referred to also as the "metallic sheet 501").

Then, as shown in FIG. 3(b), a carrier layer 505, which constitutes the carrier of an electrical connection member according to the present invention, is formed on the metallic sheet 501. In this embodiment, the carrier layer 505 is formed by applying a coat of light-sensitive resin (polyimide resin (PI)) to the metallic sheet 501 by means of a spinner and prebaking this coat of light-sensitive resin. Subsequently, the carrier layer 505 is illuminated with light through a photomask (for the purpose of exposure) and is then subjected to development. In the case of this embodiment, as shown in FIG. 3(c), the portions of the polyimide resin which have been exposed to light are not removed during the development and thus form the carrier, while the portions of the polyimide resin which have not been illuminated with light are removed by the development to form holes 142.

Thereafter, the processing temperature is increased to convert the polyimide resin into an imide compound.

Figure 3D:
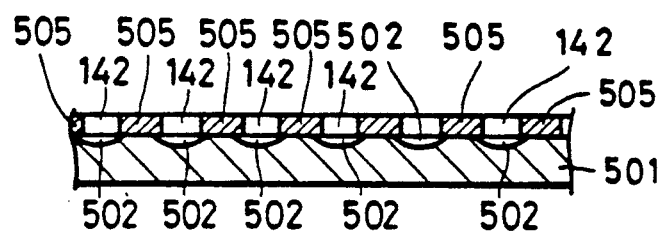

Then, as shown in FIG. 3(d), the portions of the metallic sheet 501 which are exposed at the bottoms of the respective holes 142 formed in the above step are etched to form recesses 502 in the metallic sheet 501. It is preferable for this etching to be continued until the diameter of each recess 502 exceeds the diameter of the corresponding hole 142 formed in the carrier.

Figure 3E:
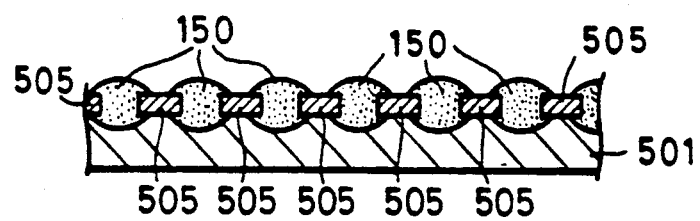

Subsequently, as shown in FIG. 3(e) a second electrically conductive material which constitutes second electrically conductive members 150 is charged into holes 142. In this embodiment, gold is used as the second electrically conductive material 150 and is charged into the holes 142 by a plating process. Gold plating is continued until bumps are formed on the exposed surface of the carrier layer 505.

It is to be noted that gold plating may be stopped when the external surfaces of the second electrically conductive members 150 become flush with the exposed surface of the carrier layer 505.

Figure 3F:
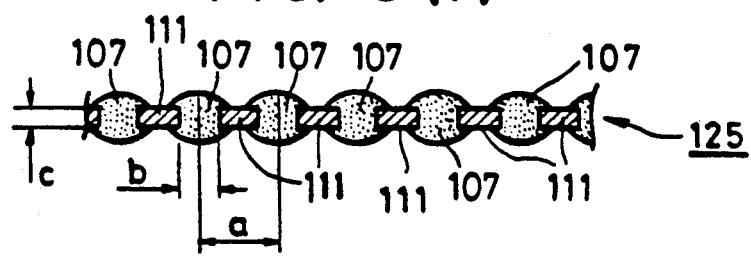
Figure 4A:
FIGS. 4(a) to 4(g) are diagrammatic cross-sectional views which serve to illustrate the process sequence of another embodiment of a method of producing electrical connection members in accordance with the present invention.
Figure 4B:
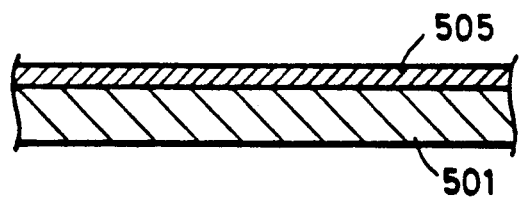
Figure 4C:
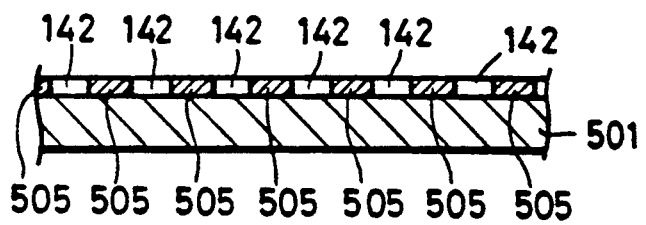
Figure 4:
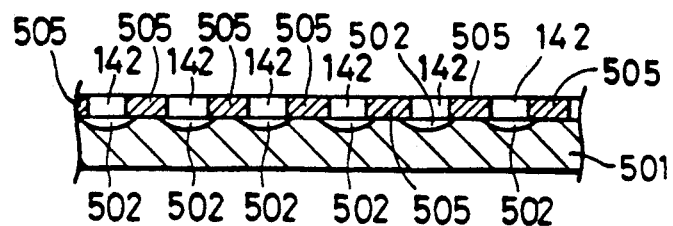
Figure 4:
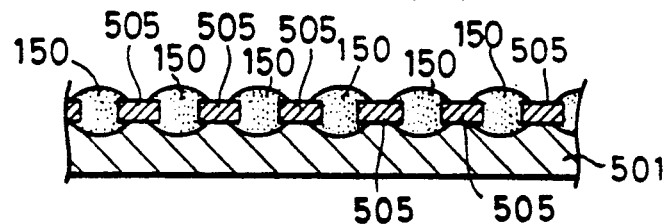
Figure 4:
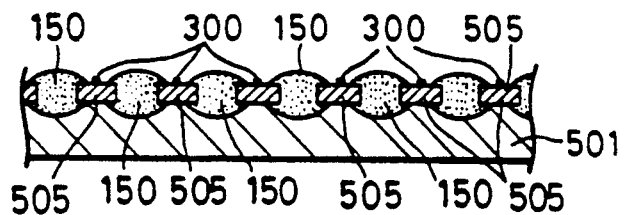
Figure 4:
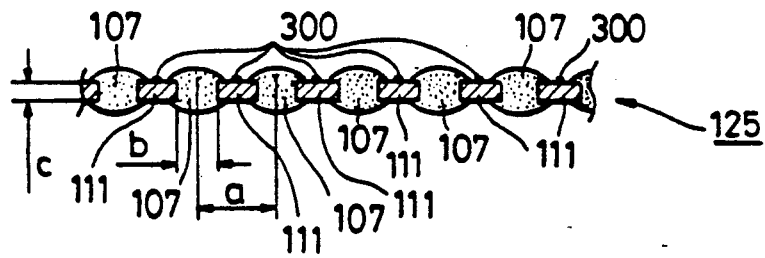

Then, as shown in FIG. 3(f), the metallic sheet 501 is removed by metal etching.

In the above-described manner, a desired electrical connection member 125 is created.

In the electrical connection member 125 thus produced, the second electrically conductive material or gold 150 charged into the holes 142 constitutes electrically conductive members 107, and the carrier layer 505 made of polyimide resin constitutes a carrier 111.

In the electrical connection member 125 produced in accordance with this embodiment, the thickness c of the carrier 111 is approximately 10 μm, and the pitch a and the diameter b of each of the electrically conductive members 107 are approximately 40 μm and approximately 20 μm, respectively. The amount of projection of each bump is several microns on either side of the carrier 111.

It is to be noted that the method of producing the electrical connection member 125 described above need not necessary include the step, shown in FIG. 3(d), of etching the metallic sheet 501. This is because, if the electrically conductive members 107 of the electrical connection member 125 are formed such as to be exposed flush with either surface of the carrier 111, the electrically conductive members 107 can achieve sufficient electrical connection with the connecting portions of another electrical circuit part.

However, from the viewpoints of the reliability of electrical connection and the necessity to prevent the electrically conductive members 107 from disconnecting from the carrier 111, it is desirable to etch the metallic sheet 501 so that each recess 502 has a greater diameter than the corresponding hole 142 formed in the carrier 111, thereby forming the contact ends of the electrically conductive members 107 into a protruding configuration.

EMBODIMENT 2

Another embodiment of the present invention will be described below with reference to FIGS. 4(a) to 4(f).

A method of producing electrical connection members in accordance with this embodiment includes the process steps shown in FIGS. 4(a) to 4(e) which are carried out in a manner similar to that used in the aforesaid embodiment 1. In Embodiment 2, the step of forming a wiring pattern 300 on the surface of the carrier layer 505 which is opposite to the other surface carrying the metallic sheet 501 is added after the step, shown in FIG. 4(e), of forming the second electrically conductive members 150.

As shown in FIG. 4(f), the wiring pattern 300 is formed in accordance with a desired configuration by depositing an electrically conductive material to constitute a wiring pattern made of, for example, copper on both the carrier layer 505 and the second electrically conductive members 150 by means of vapor deposition or sputtering, providing patterning by etching unnecessary portions, and depositing gold on this wiring pattern by plating, vapor deposition or the like. Subsequently, as shown in FIG. 4(f), the metallic sheet 501 is etched with a liquid which is able to etch the metallic sheet 501 alone, thereby forming an electrical connection member having the desired wiring pattern. Such a wiring pattern may be formed by various known methods. The electrical connection member 125 thus produced has a construction in which the wiring pattern is formed on one surface alone.

With the above-described embodiment, it is possible to form the electrical connection member 125 with a wiring pattern formed on just one of its surfaces. If it is necessary to form wiring patterns on the opposite surfaces of the electrical connection member 125, the following method may be utilized.

Specifically, after the metallic sheet 501 has been removed in the process step shown in FIG. 4(g), the above-described method may be employed to form the wiring pattern 300 on the surface of the carrier layer 505 to which the metallic sheet 501 has been bonded.

Alternatively, after the electrical connection member 125 has been formed by the method shown in Embodiment 1, wiring patterns may be formed on the opposite surfaces of this electrical connection member 125.

EMBODIMENT 3

Still another embodiment of a method of producing electrical connection members in accordance with the present invention will be described below with FIGS. 5(a) to 5(h).

Figure 5:
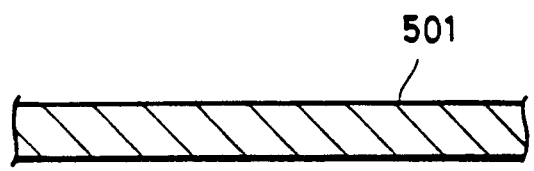
FIGS. 5(a) to 5(h) are diagrammatic cross-sectional views which serve to illustrate the process sequence of yet another embodiment of a method of producing electrical connection members in accordance with the present invention.
Figure 5:
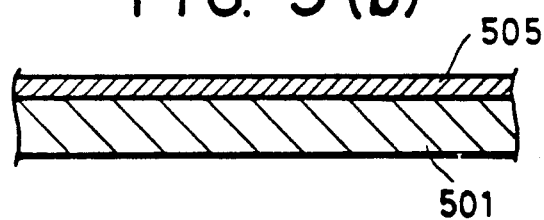
Figure 5C:
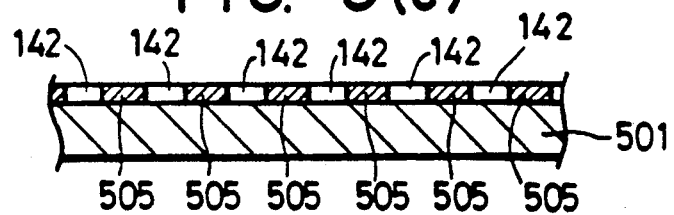
Figure 5D:
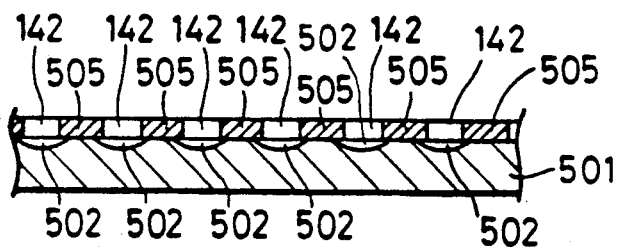
Figure 5E:
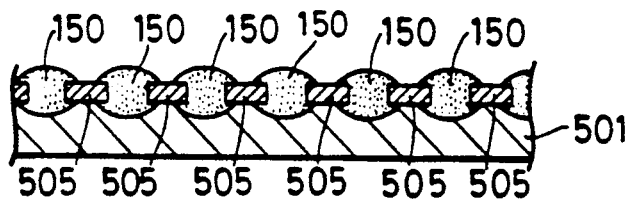
Figure 5F:
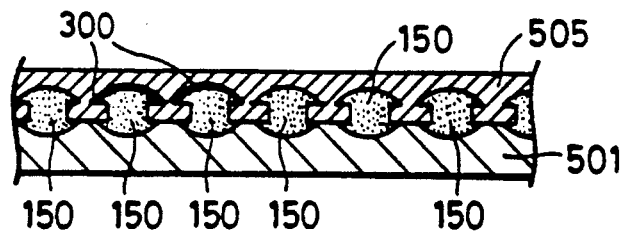
Figure 5G:
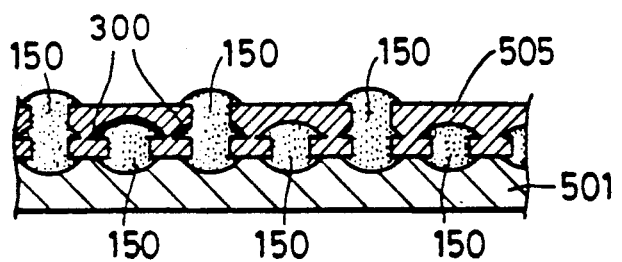
Figure 5H:
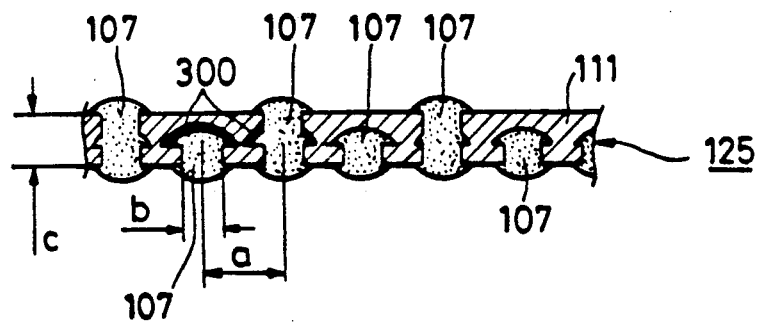

The method, shown in FIGS. 5(a) to 5(h), of producing such an electrical connection member 125 includes process steps (FIGS. 5(a) to 5(e)) which are the same as the corresponding process steps used in the method shown in each of Embodiments 1 and 2. In Embodiment 3, after the step, shown in FIG. 5(e), of forming the second electrically conductive members has been completed, a method which is similar to the method shown in Embodiment 2 of forming a wiring pattern is employed to form the wiring pattern 300 in a desired area on each of the second electrically conductive members exposed through a first carrier layer. Thereafter, as shown in FIG. 5(f), a second carrier layer 505 made of light-sensitive polyimide resin is formed to cover the wiring pattern 300. Then, as shown in FIG. 5(g), in order to form a multi-layer type electrical connection member, exposure and development of the second carrier layer are effected by process steps which are respectively similar to those shown in FIGS. 5(c) and 5(e), thereby forming desired holes, and third electrically conductive members are filled into the holes for providing electrical connection with the second electrically conductive members or the wiring pattern exposed in the holes. Then, as shown in FIG. 5(h), the metallic sheet 501 is removed by etching, thus preparing a multi-layer type of electrical connection member 125.

The multi-layer type electrical connection member 125 produced by this embodiment constitutes an electrical connection member which has a single-layer wiring pattern in its interior. In this embodiment, polyimide resin is preferably used as the constituent material of the first and second carrier layers which constitutes part of the electrical connection member 125.

Heating for the purpose of converting the first carrier layer into an imide compound is not carried out in the step shown in FIG. 5(c) in this embodiment; such heating is effected in either of the steps shown in FIGS. 5(g) and 5(h). Accordingly, no substantial interface layer is formed between the first carrier layer formed in the step of FIG. 5(b) and the second carrier layer formed in the step of FIG. 5(f), whereby it is possible to form the first and second carrier layers as a substantially single carrier layer.

Further, two or more layers of wiring patterns may be formed in the interior of the electrical connection member 125 by repeating the steps of FIGS. 5(f) to 5(g).

In this embodiment as well, such a wiring pattern may be formed on either or both of the opposite surfaces of the carrier, as described previously in connection with Embodiment 2.

As described above, with the method according to Embodiment 3, it is possible to easily form a multi-layer type electrical connection member.

The following is an explanation of an electrical circuit member and a probe card in which electrical circuit parts are connected by means of the electrical connection member 125 prepared in the above-described manner.

EXAMPLE 1 (ELECTRICAL CIRCUIT MEMBER)

An electrical circuit member which is constructed using an electrical connection member produced in accordance with the present invention will be explained below with reference to FIGS. 6(a) to 6(h).

Figure 6A:
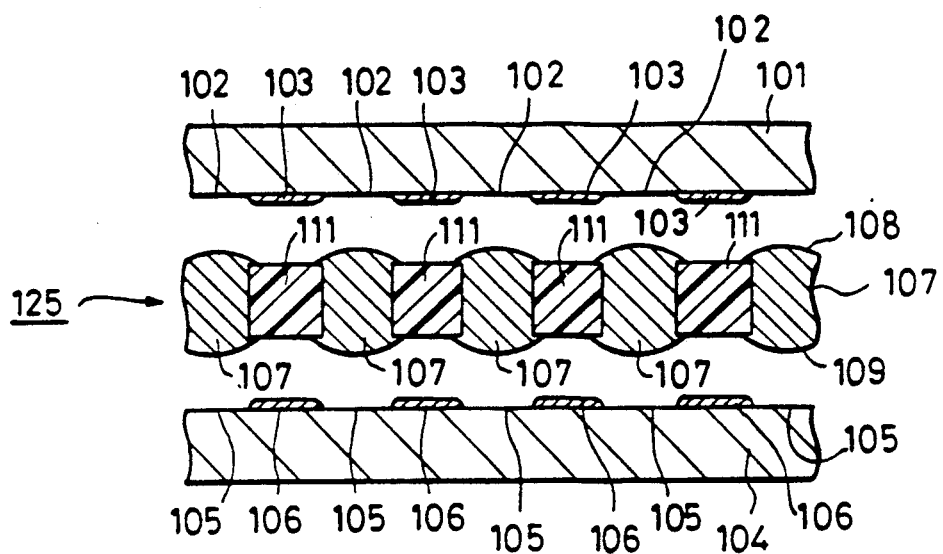
FIGS. 6(a) to 6(h) are diagrammatic cross-sectional views which serve to illustrate several examples of an electrical circuit member assembled utilizing an electrical connection member produced by the method according to the present invention.

As shown in FIG. 6(a), a semiconductor device 101 serving as an electrical circuit part, a circuit board 104 and an electrical connection member 125 for electrically connecting the elements 101 and 104 were initially prepared. The semiconductor device 101 and the circuit board 104 which were used in this example had a multiplicity of connecting portions 102 and 105, respectively. The connecting portions 102 and 105 were electrically insulated by electrical insulation films 103 and 106, respectively.

As illustrated, the connecting portions 102 of the semiconductor device 101 consist of electrical conductors which are exposed at locations corresponding to the respective connecting portions 105 of the circuit board 104 and corresponding connecting portions 108 and 109 of the electrical connection member 125.

Figure 6B:
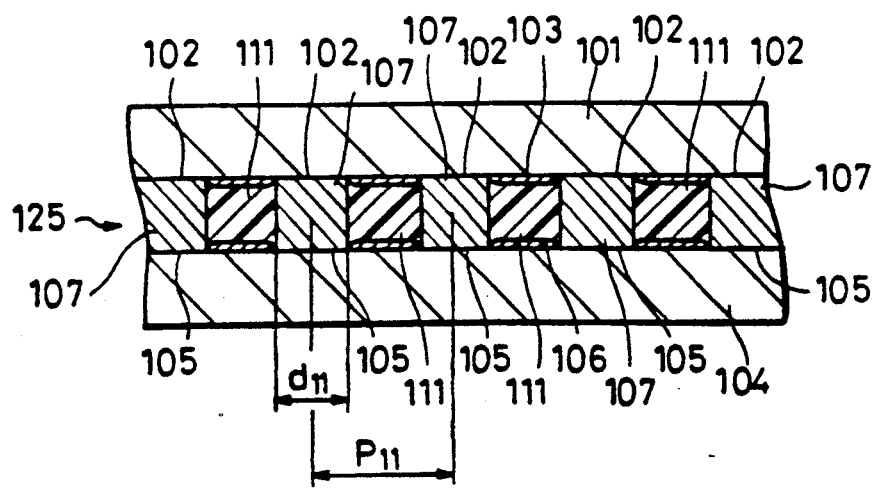

The semiconductor device 101, the circuit board 104 and the electrical connection member 125 are positioned so that the connecting portions 102 of the semiconductor device 101 correspond to the respective connecting portions 108 of the electrical connection member 125 or so that the connecting portions 105 of the circuit board 104 correspond to the connecting portions 109 of the electrical connection member 125. After this positioning, the connecting portions 102 of the semiconductor device 101 are connected to the corresponding connecting portions 108 of the electrical connection member 125 by means of a metal and/or metallic alloy formed by fusing the contacting surfaces of the connecting portions 102 and 108, while the connecting portions 105 of the circuit board 104 are connected to the corresponding connecting portions 109 of the electrical connection member 125 by means of a metal and/or metallic alloy formed by fusing the contacting surfaces of the connecting portions 105 and 109. In this way, these elements 101, 125 and 104 are connected as shown in FIG. 6(b) to prepare an electrical circuit member.

In order to connect the semiconductor device 101 to the electrical connection member 125 and the circuit board 104 to the electrical connection member 125 by forming the above-described metal and/or metallic alloy, the following three methods are available. In the first method, after the electrical connection member 125 and the circuit board 104 have been positioned with respect to each other, a metal and/or metallic alloy is formed by fusing the contacting surfaces of the connecting portions 102 of the semiconductor device 101 and the connecting portions 108 of the electrical connection member 125 and, at the same time, a metal and/or metallic alloy is formed by fusing the contacting surfaces of the connecting portions 105 of the circuit board 104 and the connecting portions 109 of the electrical connection member 125. In this way, the elements 101, 125 and 104 are connected at the same time. In the second method, the semiconductor device 101 and the electrical connection member 125 are positioned with respect to each other, and the connecting portions 102 of the semiconductor device 101 and the corresponding connecting portions 108 of the electrical connection member 125 are connected by means of a metal and/or metallic alloy formed by fusing the contacting surfaces of the connecting portions 102 and 108. Thereafter, the circuit board 104 is positioned with respect to the electrical connection member 125, and the connecting portions 109 of the electrical connection member 125 and the connecting portions 105 of the circuit board 104 are connected by means of a metal and/or metallic alloy formed by fusing the contacting surfaces of the connecting portions 109 and 105. In the third method, the circuit board 104 and the electrical connection member 125 are initially positioned with respect to each other, and the connecting portions 105 of the circuit board 104 and the connecting portions 109 of the electrical connection member 125 are connected by means of a metal and/or metallic alloy formed by fusing the contacting surfaces of the connecting portions 105 and 109. Then, the semiconductor device 101 is positioned with respect to the electrical connection member 125, and the connecting portions 108 of the electrical connection member 125 and the connecting portions 102 of the semiconductor device 101 are connected by means of a metal and/or metallic alloy formed by fusing the contacting surfaces of the connecting portions 108 and 102.

A typical example of the method of forming such a metal or metallic alloy is to bring the connecting ends of an electrical connection member into contact with corresponding connecting portions of a desired electrical circuit part and apply heat at an appropriate temperature. Thus, diffusion or the like of atoms occurs in the vicinity of each contacting portion due to heating, and the thus-diffused portions are transformed into the metal or metallic alloy, thereby forming a layer of metal or metallic alloy.

If, Au and Al are used for the metallic member of the electrical connection member and the connecting portions of an electrical circuit part, respectively, it is preferable that the heating temperature be set to 200°–350° C.

The heating method may be one kind selected from among internal heating methods such as thermocompression bonding, ultrasonic heating, high-frequency induction heating, high-frequency dielectric heating, microwave heating, and the like, or from among various other external heating methods, or it may be a combination of two or more kinds selected from among these heating methods. In any of the heating methods, the connecting portions are connected by heating them either directly or indirectly.

If the present invention is to be applied to an electrical circuit part of the interchangeable type, a connecting method which enables removable connection may be selected.

For example, in the case of a connection utilizing the formation of the metal or metallic alloy layer described above, it is preferable that the melting point of the metal or metallic alloy layer formed by fusing the contacting surfaces of the electrical connection member and an electrical circuit part to be removably connected be made lower than the melting point of the metal or metallic alloy layer formed by fusing the electrical connection member and an electrical circuit part to be non-removably connected. If these melting points are selected in this manner, it is possible to remove only a desired removable electrical circuit part without exerting adverse influence, such as physical damage, on the connecting portions of the nonremovable electrical circuit parts. This is accomplished by the application of heat at a temperature which is higher than the melting point of the metal or metallic alloy layer of the desired removable electrical circuit part and which is lower than the melting point of the metal or metallic alloy layer of the nonremovable electrical circuit part. In the present invention, the "removable connection" embraces the above form of connection as well.

Further, if a failure of any kind occurs in an electrical circuit part, the part in question can be replaced with another electrical circuit part owing to the above-described removable connection. It is, therefore, possible to reduce the manufacturing cost, repair cost, or the like.

If an electrical circuit part which tends to easily break down is known, it will be possible to easily replace only the electrical circuit part that is out of order, owing to the fact that the melting point of the metal and/or metallic alloy layer of the electrical circuit part in question is selected to be lower than the melting point of the metal or metallic alloy layer of another electrical circuit part. In this case as well, it is possible to reduce the manufacturing cost, repair cost, or the like.

As described above, individual electrical circuit parts are connected via the electrical connection member by the formation of the metal and/or metallic alloy layer described above. Accordingly, since the electrical circuit parts are connected to each other firmly (with high strength) and reliably, it is possible to provide an electrical circuit device having connections of reduced resistance and of uniform resistance characteristics, improved mechanical strength, and an extremely low failure rate.

In addition, since individual electrical circuit parts are connected via the electrical connection member by means of the metal and/or metallic alloy layer formed as described above, it is unnecessary to retain electrical circuit parts with jigs or the like during or after the manufacture of electrical circuit devices. Accordingly, the manufacture of electrical circuit devices and the storage of manufactured electrical circuit devices are facilitated.

Figure 6C:
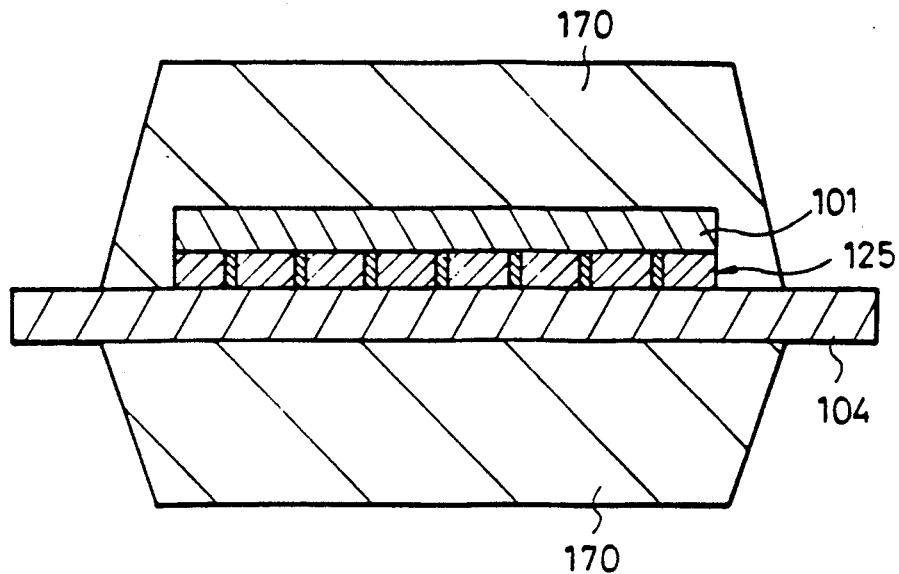

The electrical circuit parts of the electrical circuit member thus produced were sealed with a sealing compound in the manner shown in FIG. 6(c). In this example, both the semiconductor device 101 and the circuit board 104 were sealed. The sealing compound employed was thermoplastic resin and the sealing method was injection molding.

The above thermoplastic resin may be selected from the group consisting of, for example, polyimide resin, polyphenylene sulfide resin, polyether sulfone resin, polyether imide resin, polysulfone resin, fluororesin, polycarbonate resin, polydiphenyl ether resin, polybenzyl imidazole resin, polyamide imide resin, polypropylene resin, polyvinyl chloride resin, polystryrene resin, methacrylate methyl resin and similar kinds of resin.

The above sealing compound may be selected from the above noted group or it may be of the type in which one or more materials selected from among metal, alloy and inorganic material in the form of powder, fibers, plate-like grains, rod-like grains, or spherical grains are dispersed in any of the aforesaid thermoplastic resins.

This dispersion may be effected by adding an arbitrary material in the form of powder, fibers, plate-like grains, rod-like grains, or spherical grains to a selected resin and agitating the mixture. As a matter of course, instead of this method, another arbitrary method may be employed to disperse, in a selected resin, a material in the form of powder, fibers, plate-like grains, rod-like grains, or spherical grains.

The aforesaid metal or alloy may be selected from the group consisting of, for example, Ag, Cu, Au, Al, Be, Ca, Mg, Mo, Fe, Ni, Si, Co, Mn and W.

The aforesaid inorganic material may be selected from the group consisting of, for example, $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, and other inorganic materials such as ceramics, diamond, glass, carbon, boron, and the like.

The size and the configuration of powder particles, fibers, plate-like grains, rod-like grains, or spherical grains to be dispersed may be arbitrarily selected. Moreover, the position of dispersion in the insulating resin and the amount of material to be dispersed may also be arbitrarily determined. The powder, fibers, plate-like grains, rod-like grains or spherical grains may be or may not be exposed to the outside of the insulating resin. In addition, the powder, fibers, plate-like grains, rod-like grains, or spherical grains may be or may not be in contact with one another.

In the present invention, if a material of good heat conductivity is dispersed in the sealing compound, in the form of powder, fibers, plate-like grains, rod-like grains, spherical grains, or the like, the heat generated in electrical circuit parts or a probe card can rapidly escape to the outside. Accordingly, an electrical circuit device of good heat dissipation properties is obtained. If one or more kinds selected from among powder, fibers, plate-like grains, rod-like grains, spherical grains, and the like with a thermal expansion coefficient close to that of an electrical circuit part are dispersed in the sealing compound used in the invention, the thermal expansion coefficient of the sealing compound approximates that of the electrical circuit part. Accordingly, it is possible to prevent phenomena which may deteriorate the reliability of the electric circuit device, such as cracks in a sealing portion or the electrical circuit part or variations in the characteristics thereof which may be caused by the application of heat. It is, therefore, possible to provide a highly reliable electrical circuit member.

When the connection characteristics of the connecting portions of the electrical circuit member which was produced in the above-described manner were examined, it was found that the connecting portions were connected with high reliability.

In addition, various other characteristics exhibited high reliability.

In addition to the electrical circuit member shown in FIG. 6(c), electrical circuit members of other forms such as those shown in FIGS. 6(d) to 6(h) were produced.

Figure 6D:
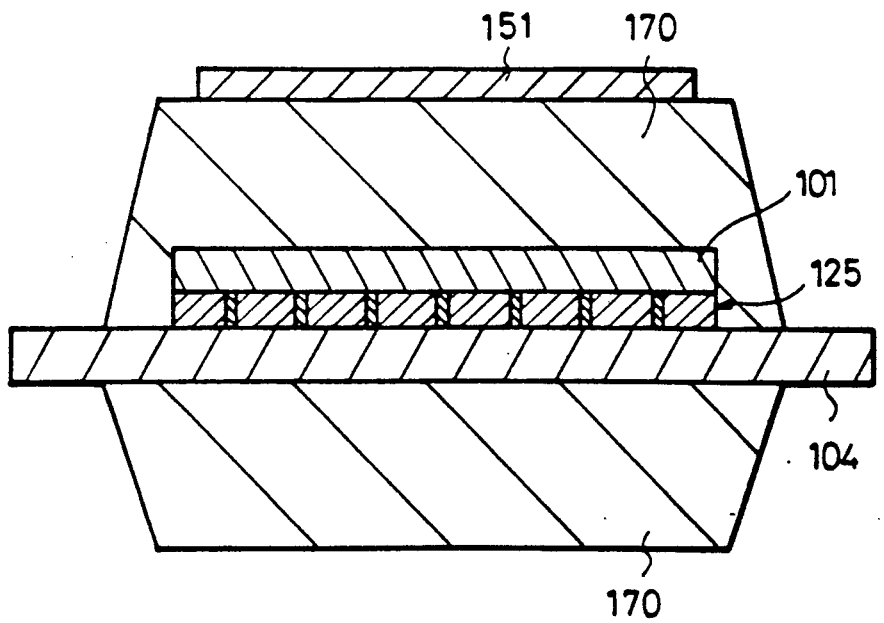

FIG. 6(d) shows an example in which a 0.1 mm thick sheet 151 made of stainless steel is bonded to the surface of a sealing material 170 of the electrical circuit member of FIG. 6(c).

Figure 6E:
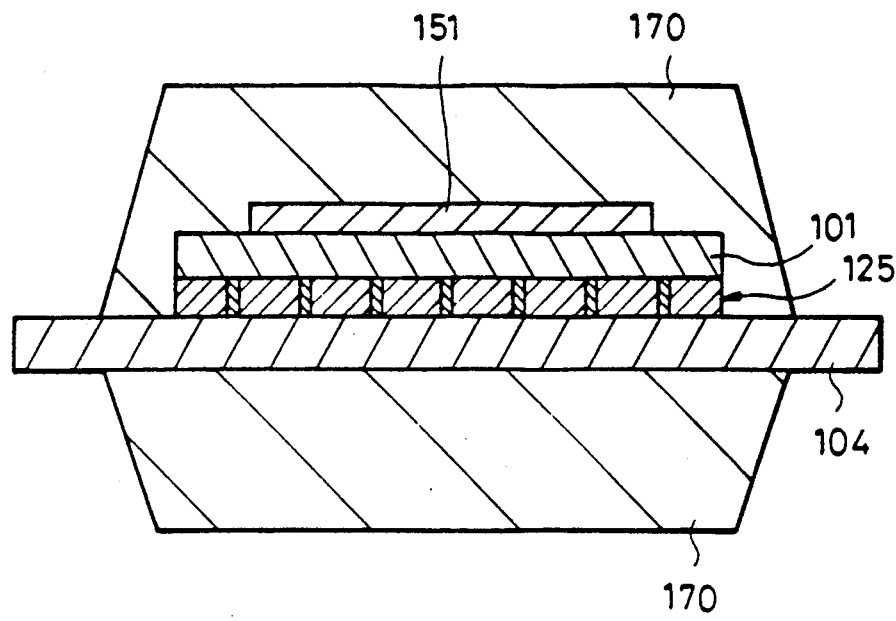

FIG. 6(e) shows another example in which the 0.1 mm thick sheet 151 made of stainless steel is bonded to the surface of the semiconductor device 101 which is opposite to the electrical connection member 125 in the electrical circuit member of FIG. 6(c). In this example, the sheet 151 is bonded to the semiconductor device 101 alone.

Figure 6F:
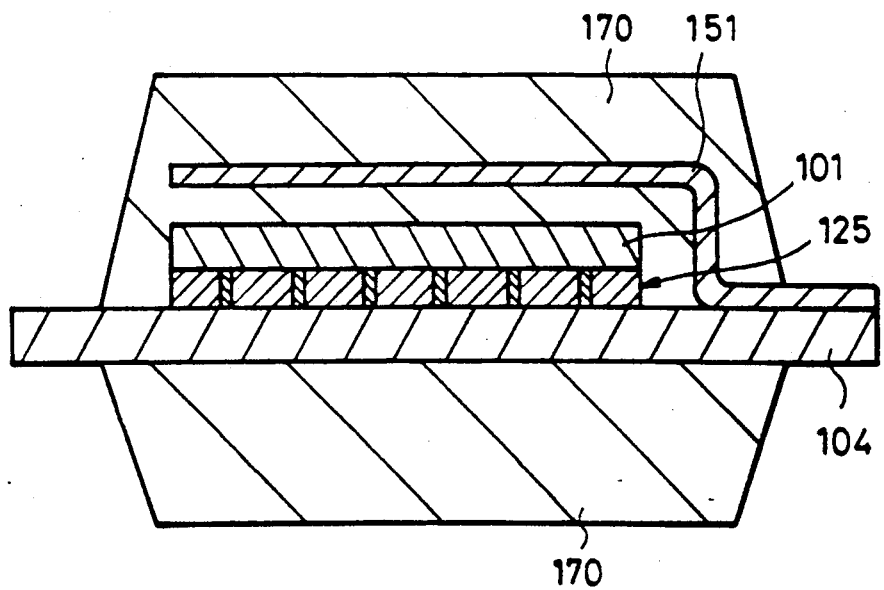

FIG. 6(f) shows still another example in which the 0.1 mm thick sheet 151 made of stainless steel is disposed in the vicinity of the semiconductor device 101 in the electrical circuit member shown in FIG. 6(c).

In each of the above examples, it is possible to use any kind of sheet which is made of material different from the sealing material.

The thickness of the stainless sheet is preferably 0.05-0.5 mm.

The bonding method is not limited to a specific method, and various methods can be employed. For example, the sheet may be bonded by using an adhesive or the like.

If the sheet is made of metal such as stainless steel, a ceramic of good heat conductivity, carbon, diamond or the like, the heat generated from an electrical circuit part can be rapidly dissipated to the exterior. Accordingly, it is possible to provide an electrical circuit device having good heat-dissipation characteristics. If the sheet is made of metal, the penetration of external noise can be prevented and it is therefore possible to make the device insusceptible to the influence of external noise. Moreover, since electromagnetic noise generated from electrical circuit parts can be blocked, it is possible to provide an electrical circuit member of good characteristics without high noise.

In accordance with the present invention, the above-described sheet is provided on the outside surface of the sealing portion or is buried therein. Accordingly, even if internal stress occurs in the electrical circuit member or external stress is applied to it, it is possible to suppress stress concentration and, hence, prevent cracks or the like which may occur due to stress concentration. The above sheet also serves as protecting means for protecting the electrical circuit parts from the influences of the exterior. Accordingly, it is possible to prevent water or other foreign matter from easily penetrating the electrical circuit parts, whereby the reliability of the electrical circuit member can be improved.

Figure 6G:
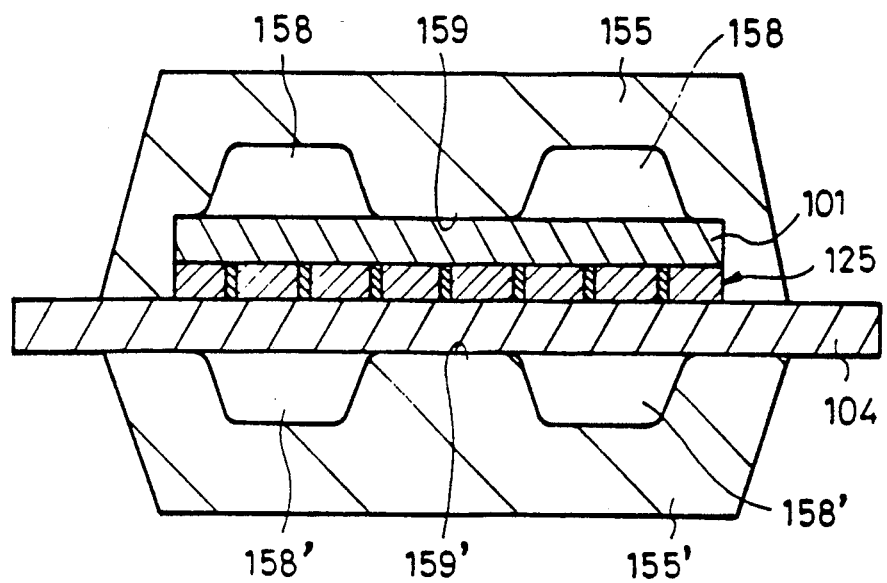

FIG. 6(g) shows yet another example in which each of the circuit board 104 and the semiconductor device 101 is sealed with a cap in the electrical circuit member shown in FIG. 6(c).

The term "seal(ed) with a cap" means that a cap is employed to wrap an electrical circuit part to seal the same with a certain cavity remaining in the interior of the cap.

The cap may be provided on only one of the electrical circuit parts to be sealed, or a plurality of caps may be provided on individual electrical circuit parts to be sealed.

In FIG. 6(g), the caps used in this example are denoted by 155 and 155', respectively. As illustrated, each of the caps 155 and 155' has two recesses formed in its interior. The recesses of the cap 155 form cavities 158 and those of the cap 155' form cavities 158'. A projecting portion 159 abuts against the facing surface (reverse surface) of the semiconductor device 101 while a projecting portion 159' abuts against the facing surface (reverse surface) of the circuit board 104. The semiconductor device 101 and the circuit board 104 are firmly held against the electrical connection member 125 by the projecting portions 159 and 159', respectively.

In this example, the caps 155 and 155' are bonded to each other with an adhesive.

If each of the caps 155 and 155' is made of material having good noise filtering characteristics, particularly iron or an alloy thereof, it is possible to provide an electrical circuit member which has a further improved function of shielding the incorporated electrical circuit parts from external noise.

Since the electrical circuit parts are sealed with the caps with cavities remaining in the electrical circuit member, little thermal stress occurs even if heat is applied to the electrical circuit member. Accordingly, it is possible to provide a highly reliable electrical circuit member. If each of the caps which abut against the electrical circuit parts is made of material of good heat conductivity, heat generated from the electrical circuit parts is rapidly conducted through the caps to the exterior. Accordingly, it is possible to provide an electrical circuit member whose heat-dissipating function is further improved.

Figure 6H:
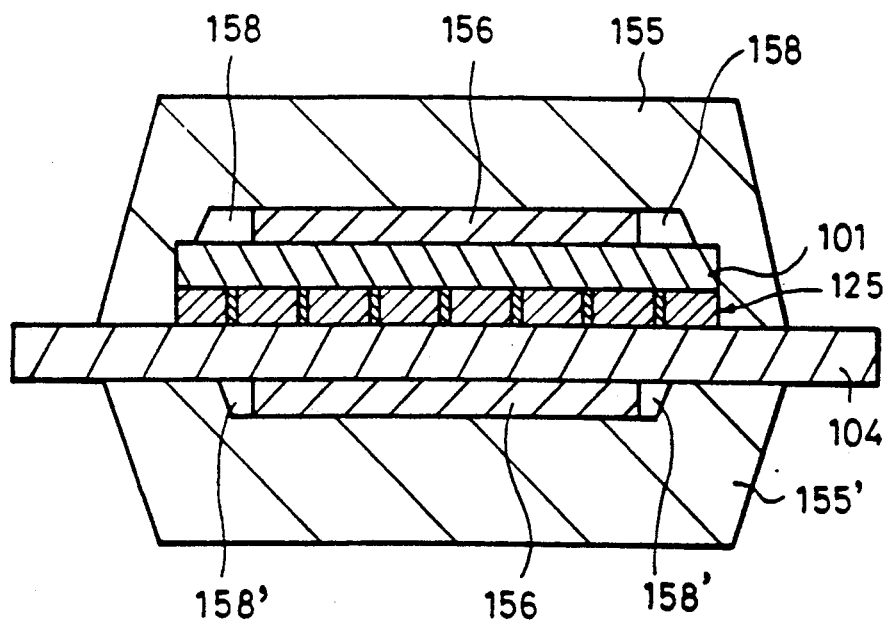

FIG. 6(h) shows another example in which the semiconductor device 101 and the circuit board 104 of the electrical circuit member of FIG. 6(c) are sealed with the caps 155 and 155', respectively, in a similar manner to that used in the example of FIG. 6(g), but in which two adjustment members 156 are provided for adjusting the dimension of each of the electrical circuit parts in the direction of the height thereof. One of the adjustment members 156 is interposed between the semiconductor device 101 and the cap 155, the other between the circuit board 104 and the cap 155'.

The interposition of the adjustment members 156 between the cap 155 and one of the electrical circuit parts and between the cap 155' and the other electrical circuit part makes it possible to efficiently assemble the electrical circuit member even if individual electrical circuits differ in height.

Each of the adjustment members may be made of metallic material, inorganic material, or organic material, and it is desirable to use a material having elasticity.

The adjustment member may have any configuration that allows the dimension of each electrical circuit part to be adjusted in the direction of the height thereof.

Each of the examples described above employs the electrical connection member produced in accordance with Embodiment 1. However, the electrical connection member produced in accordance with either of Embodiments 1 and 2 can also be used to provide an electrical circuit member having reliability which is as high as the reliability of the above-described electrical circuit member.

If the electrical connection member produced by the method of the present invention is applied to an electrical circuit member, the connecting portions of each electrical circuit part can be provided along its end portion at high density. Accordingly, it is possible to increase the number of connecting portions to be provided at the end portion, whereby the density of connecting portions can be made high.

Moreover, since the thickness of the electrical connection member can be made small, it is possible to reduce the total thickness of the electrical circuit member.

In addition, since the amount of conductor material used in the electrical connection member can be reduced, it is possible to reduce the manufacturing cost even if expensive conductor material is used.

EXAMPLE 2 (PROBE CARD)

An example of a probe card which is constructed using an electrical connection member produced by the method according to the present invention will be described below with reference to FIGS. 7(a), 7(b) and 7(c).

In the following example, the electrical connection member 125 produced by the method of Embodiment 1 is utilized, but W or an alloy thereof is used for the second electrically conductive members and one side of each bump is formed into an acute configuration. Moreover, in order to make reliable the connection between the electrical connection member 125 and an electrical circuit part, predetermined portions are plated with solder after the second electrically conductive members have been formed by the process step shown in FIG. 3(e).

Figure 7:
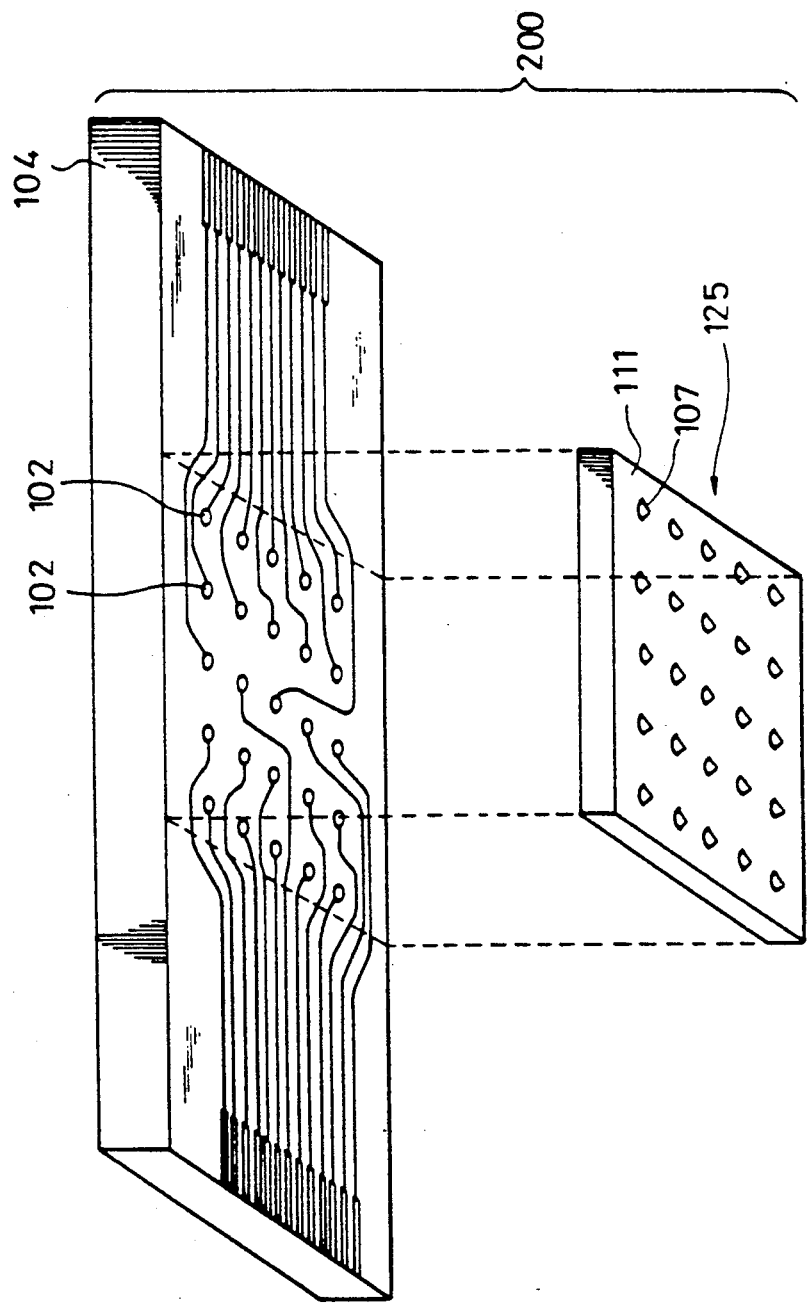
FIG. 7(a) is a diagrammatic perspective view showing an example of a probe card assembled utilizing an electrical connection member produced by the method according to the present invention.
FIGS. 7(b) and 7(c) are diagrammatic cross-sectional views of the example shown in FIG. 7(a)

As shown in FIG. 7(a), the circuit board 104 as an electrical circuit part and the electrical connection member 125, which constitutes the probing portion of the probe card, are initially prepared. The circuit board used in this example has a multiplicity of connecting portions 102 in its interior.

The connecting portions 102 of the circuit board 104 consist of electrically conductive members which are exposed at locations corresponding to the respective connecting portions 108 of the electrical connection member 125.

The positions of the circuit board 104 and the electrical connection member 125 are initially adjusted so that the connecting portions 102 correspond to the connecting portions 108 as shown in FIG. 7(b). Then, the connecting portions 102 (in this example, made of Cu and plated with solder) of the circuit board 104 and the connecting portions 108 (in this example, made of W and plated with solder) of the electrical connection member 125 are bonded by brazing material. A probe card 200 is prepared in this manner.

The following is a description, referring to FIG. 7(c), of a method of measuring the electrical characteristics of an electrical part by means of the probe card 200 thus produced.

In the following example of measurement, the semiconductor device 101 is employed as an electrical part to be measured. The semiconductor device 101 has connecting portions which are arranged at a pitch of 40 μm.

The positions of the semiconductor device 101 and the electrical connection member 125 are adjusted so that the connecting portions 105 correspond to the connecting portions 109. Then, the connecting portions 105 (in this example, made of Al) of the semiconductor device 101 and the connecting portions 109 (in this example, made of W) of the electrical connection member 125 are bonded as shown in FIG. 7(c). In this state, the electrical characteristics of the semiconductor device 101 are measured. Incidentally, the connection formed in this step is a temporary connection, and after the measurement has been completed, the semiconductor device 101 can be easily removed from the probe card 200. Accordingly, each time measurement is taken, the semiconductor device 101 can be attached to and detached from the probe card 200. Although the attachment and detachment of the semiconductor device 101 were experimentally repeated a plurality of times, little abrasion occurred in the electrically conductive members which constituted the connecting portions 109 when making contact with the connecting portions 105 of the semiconductor device 101, and it was proved that the probe card 200 produced in Example 2 was of high reliability.

EXAMPLE 3

Figure 8A:
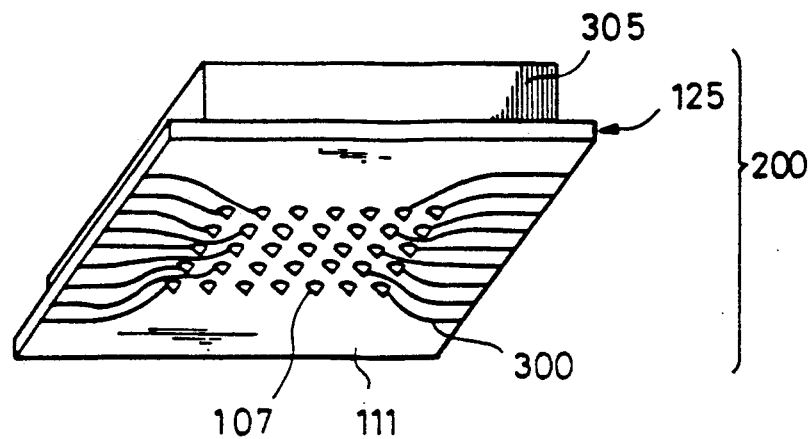
FIG. 8(a) is a diagrammatic perspective view showing another form of a probe card assembled utilizing an electrical connection member produced by the method according to the present invention.
Figure 8B:
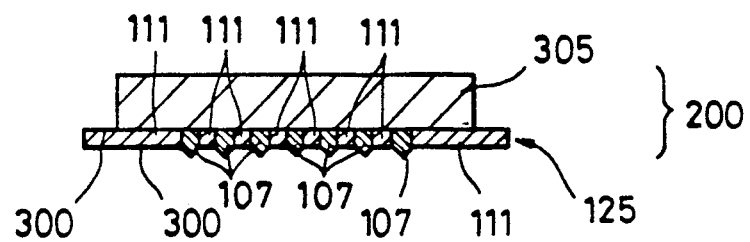
FIGS. 8(b) and 8(c) are diagrammatic cross-sectional views of the example shown in FIG. 8(a).
Figure 8C:
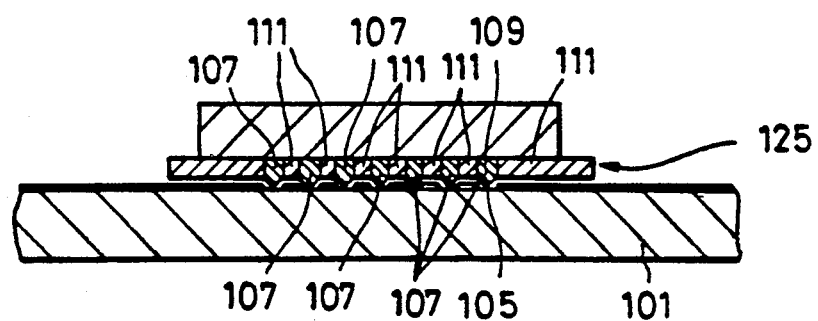

FIGS. 8(a), 8(b) and 8(c) diagrammatically show another form of the probe card 200 produced in Example 2.

As shown in FIGS. 8(a) and 8(c), the probe card 200 produced in Example 2 includes an electrical connection member, denoted by 125, having a surface with a wiring pattern formed by a method similar to the method explained in Embodiment 2, and further includes a reinforcement plate 305 provided on the electrical connection member 125.

The electrical connection member 125 used in Example 3 is produced by the method explained in Embodiment 2. However, in the step, shown in FIG. 4(e), of forming the second electrically conductive members 150, none of the portions of the second electrically conductive members 150 which are exposed on the side opposite to the metallic sheet 501 is formed into a bump and these exposed portions are made approximately flush with the corresponding surface of the carrier 111. In this example, the second electrically conductive member 150 prepared in the process step shown in FIG. 4(e) is formed utilizing Au plating, W plating or W-alloy plating, followed by solder plating.

As shown in FIG. 8(a), the probe card 200 having the above-described construction is connected to the semiconductor device 101 which is an electrical circuit part to be measured, and the electrical characteristics of the semiconductor device 101 are measured by a method similar to that shown in Example 2.

The electrical connection member used in each of Examples 2 and 3 is not limited to the above-described specific example, and it is possible to use any of the electrical connection members which are produced by the methods shown in Embodiments 1 to 3.

The use of a probe card utilizing an electrical connection member of the type achieved in accordance with the present invention makes it possible to facilitate the measurement of electrical characteristics, such as current, voltage, frequency characteristics and the like of electrical circuit parts of the type in which connecting portions are provided on their outer edge portions or in their interiors. Moreover, since the electrically conductive members of the electrical connection member can be formed at a narrow pitch, the number of connecting portions can be increased and it is, therefore, possible to measure electrical parts of the type having a multiple-pin connection.

As described above, in accordance with the present invention, since resin is used which varies in hardness when illuminated with light, it is possible to very easily produce electrical connection members.

Moreover, since the production method according to the present invention utilizes a process for applying a coat of resin, it is possible to produce very thin electrical connection members. In addition, since the longitudinal size of each electrically conductive member in the electrical connection member can be made small, it is possible to achieve stable connections whose electrical resistance and stray capacitance are reduced and which can reduce the level of noise coming from the exterior.

Further, since holes to be filled with the electrically conductive members are formed by photolithography, it is possible to easily increase the density of connecting portions of the electrical connection member. Since the operation of positioning electrical circuit parts with respect to the electrical connection member can be simplified, it is also possible to eliminate the complicated positioning operation.

Further, since polyimide resin is used as resin which varies in hardness when illuminated with light, it is possible to produce highly reliable electrical connection members which excel in heat resistance, weather resistance, and shielding effect with respect to harmful electromagnetic waves.

Furthermore, since recesses each having a diameter larger than a corresponding hole formed in a carrier are formed in the first electrically conductive member by etching, each of the second electrically conductive members can be easily formed into a bump-like configuration. Accordingly, it is possible to prevent the second electrically conductive members from accidentally coming away from the carrier and it is also possible to achieve stable connections between electrical circuit parts and the second electrically conductive members.

In accordance with the present invention, it is also possible to very easily achieve an electrical connection member having a multiple-layer construction.

What is claimed is:

1. A method for producing electrical connection members, comprising the steps of:

forming a layer of light-sensitive resin on a substrate member for supporting materials to be used for forming said electrical connection members;

forming holes through said layer of light-sensitive resin by patterning predetermined portions of said layer of light-sensitive resin;

heating the layer of light-sensitive resin;

filling each hole with an electrically conductive member; and removing the substrate member.

2. A method according to claim 1, further comprising the step of etching, prior to filling the holes, the portions of the substrate member exposed through the holes formed in the carrier to form recesses corresponding to the holes so that each recess has a diameter larger than the diameter of a corresponding hole in the carrier.

3. A method according to claim 2, wherein each electrically conductive member fills the respective recess formed in the substrate member, with the electrically conductive members forming bumps which have protruding configurations and comprise part of an electrical connection member.

4. A method according to claim 1, further comprising the step of forming a wiring pattern on at least one surface of the carrier.

5. A method according to claim 1, wherein each electrically conductive member has a bump-like configuration which projects above a corresponding surface of the carrier.

6. A method according to claim 1, further comprising the step of fusing the electrically conductive members to respective connecting portions of an electrical circuit part by using either one of a metal and a metallic alloy to fuse contacting surface of the connecting portions and the electrically conductive members.

7. A method according to claim 6, wherein the fusing step uses either one of an internal heating process and an external heating process.

8. A method according to claim 1, further comprising the step of connecting the electrically conductive members to respective connecting portions of a probe card for measuring electrical characteristics of an electrical circuit member in contact with the probe card.

9. A method of producing electrical connection members, comprising the steps of:

forming a first layer of light-sensitive resin on a substrate member for supporting materials to be used for forming said electrical connection members;

forming holes through the first layer of light-sensitive resin by patterning predetermined portions of the first layer of light-sensitive resin;

filling each hole with a first electrically conductive member;

forming a second layer of light-sensitive resin on the first layer of light-sensitive resin filled with the first electrically conductive members;

forming holes through the second layer of light-sensitive resin by patterning predetermined portions of the second layer of light-sensitive resin;

filling each hole in the second layer of light-sensitive resin with a second electrically conductive member;

heating the first and second layers of light-sensitive resin; and removing the substrate member.

10. A method according to claim 9, further comprising the step of etching, prior to filling the holes, the portions of the substrate member exposed through the holes formed in the first carrier to form recesses in the substrate member corresponding to the holes so that each recess has a diameter larger than the diameter of a corresponding hole in the first carrier.

11. A method according to claim 10, wherein each first electrically conductive member is filled into the respective recess formed in the substrate member, with the first electrically conductive members forming bumps which have protruding configurations and which comprise part of an electrical connection member.

12. A method according to claim 9, further comprising the step of forming a wiring pattern on at least one of the surfaces of the first carrier and the first electrically conductive members.

13. A method according to claim 9, wherein each first electrically conductive member and second electrically conductive member has a bump-like configuration which projects above a corresponding surface of the first and second carriers, respectively.

14. A method according to claim 9, further comprising the step of connecting the first electrically conductive members exposed at one surface of the first carrier and the second electrically conductive members exposed at an opposite facing surface of the second carrier to respective connecting portions of an electrical circuit part by fusing contacting surfaces of the connecting portions and first and second electrically conductive members with either one of a metal and a metallic alloy.

15. A method according to claim 14, wherein the fusing step uses either one of an internal heating process and an external heating process.

16. A method according to claim 9, further comprising the step of connecting the second electrically conductive member exposed at one surface of the first carrier to respective connecting portions of a probe card, with the first electrically conductive members being exposed at an opposite facing surface of the second carrier for measuring the electrical characteristics of a member in contact with respective connecting portions of the probe card.

17. A method according to claim 9, wherein the steps of applying a second carrier containing a light sensitive resin on the first carrier, forming holes in predetermined portions of the second carrier to expose the first electrically conductive members through each of the holes, and filling each hole formed in the second carrier with a second electrically conductive member, are performed at least once.

* * * * *

UNITED STATES PATENT AND TRADEMARK OFFICE
CERTIFICATE OF CORRECTION

PATENT NO. : 5,216,807

DATED : June 8, 1993

INVENTOR(S) : Yoshizawa, et al.

It is certified that error appears in the above-indentified patent and that said Letters Patent is hereby corrected as shown below:

On title page, item

[56] REFERENCES CITED:

U.S. PATENT DOCUMENTS, "Park et al." should read --Parks et al.--.

COLUMN 1:

Line 9, "4,926,549." should read --4,926,549, issued May 22, 1990.--.

COLUMN 3:

Line 2, "and etching," should read --etching, and--.
Line 21, "and;" should be deleted.
Line 35, "carrier, thereby partially exposing" should read --carrier to expose--.

COLUMN 13:

Line 41, "If," should read --If--.

UNITED STATES PATENT AND TRADEMARK OFFICE
CERTIFICATE OF CORRECTION

PATENT NO. : 5,216,807        Page 2 of 2

DATED : June 8, 1993

INVENTOR(S) : Yoshizawa, et al.

It is certified that error appears in the above-indentified patent and that said Letters Patent is hereby corrected as shown below:

COLUMN 20:

Line 62, "surface" should read --surfaces--.

Signed and Sealed this

Twelfth Day of April, 1994

*Attest:*

BRUCE LEHMAN

*Attesting Officer*     *Commissioner of Patents and Trademarks*